United States Patent
Seok

(10) Patent No.: US 10,319,669 B2
(45) Date of Patent: Jun. 11, 2019

(54) PACKAGED FAST INVERSE DIODE COMPONENT FOR PFC APPLICATIONS

(71) Applicant: IXYS, LLC, Milpitas, CA (US)

(72) Inventor: Kyoung Wook Seok, Milpitas, CA (US)

(73) Assignee: IXYS, LLC, Milpitas, CA (US)

(*) Notice: Subject to any disclaimer, the term of this patent is extended or adjusted under 35 U.S.C. 154(b) by 0 days.

(21) Appl. No.: 15/693,416

(22) Filed: Aug. 31, 2017

(65) Prior Publication Data
US 2019/0067174 A1  Feb. 28, 2019

(51) Int. Cl.
*H01L 23/495* (2006.01)
*H01L 23/31* (2006.01)
(Continued)

(52) U.S. Cl.
CPC .... *H01L 23/49575* (2013.01); *H01L 23/3114* (2013.01); *H01L 23/4952* (2013.01); *H01L 23/49513* (2013.01); *H01L 23/49562* (2013.01); *H02M 1/4225* (2013.01); *H01L 29/0623* (2013.01); *H01L 29/0692* (2013.01); *H01L 29/086* (2013.01); *H01L 29/0878* (2013.01); *H01L 29/1095* (2013.01); *H01L 29/167* (2013.01); *H01L 29/456* (2013.01); (Continued)

(58) Field of Classification Search
CPC ......... H01L 23/49575; H01L 23/49562; H01L 23/4952; H01L 23/3114; H01L 29/0623; H01L 29/495; H01L 29/8611; H01L 29/51; H01L 29/0692; H01L 29/0878; H01L 29/7802; H01L 29/086; H01L 29/456; H01L 29/1095; H02M 1/4225
See application file for complete search history.

(56) References Cited

U.S. PATENT DOCUMENTS 4,351,677 A  9/1982 Mochizuki et al. .......... 148/188
5,142,347 A  8/1992 Voss
(Continued)

FOREIGN PATENT DOCUMENTS

EP  0361316  9/1988
EP  0361320  9/1988
(Continued)

OTHER PUBLICATIONS

Biermann et al., "New 3300V High Power Emcon-HDR Diode with High Dynamic Robustness," eupec GmbH and Infineon Technologies, Warstein, Germany 2009 (5 pages).
(Continued)

*Primary Examiner* — Sonya D. McCall-Shepard

(57) ABSTRACT

A novel four-terminal packaged semiconductor device is particularly useful in a 400 volt DC output PFC boost converter circuit. Within the body of the package an NFET die and a fast inverse diode die are mounted such that a bottomside drain electrode of the NFET is electrically coupled via a die attach tab to a bottomside P type anode region of the inverse diode. First terminal T1 is coupled the die attach tab. Second terminal T2 is coupled to the gate of the NFET die. Third terminal T3 is coupled to the source of the NFET die. Fourth terminal T4 is coupled to a topside cathode electrode of the fast inverse diode die. Due to a novel P+ type charge carrier extraction region of the inverse diode die, the packaged device is fast and has a low reverse leakage current in the PFC boost converter circuit application.

20 Claims, 7 Drawing Sheets

PACKAGED DEVICE IN A PFC BOOST CONVERTER

(51) Int. Cl.
| | |
|---|---|
| *H02M 1/42* | (2007.01) |
| *H01L 29/08* | (2006.01) |
| *H01L 29/06* | (2006.01) |
| *H01L 29/10* | (2006.01) |
| *H01L 29/78* | (2006.01) |
| *H01L 29/861* | (2006.01) |
| *H01L 29/51* | (2006.01) |
| *H01L 29/49* | (2006.01) |
| *H01L 29/45* | (2006.01) |
| *H01L 29/167* | (2006.01) |

(52) U.S. Cl.
CPC ............ *H01L 29/495* (2013.01); *H01L 29/51* (2013.01); *H01L 29/7802* (2013.01); *H01L 29/8611* (2013.01)

(56) References Cited

U.S. PATENT DOCUMENTS

| | | | |
|---|---|---|---|
| 5,698,454 | A | 12/1997 | Zommer .......................... 437/6 |
| 6,507,050 | B1 | 1/2003 | Green ............................ 257/170 |
| 6,936,908 | B2 | 8/2005 | Kelberlau et al. ............. 257/502 |
| 7,030,426 | B2 | 4/2006 | Neidig ........................... 257/170 |
| 7,442,630 | B2 | 10/2008 | Kelberlau et al. ............. 438/510 |
| 8,093,652 | B2 | 1/2012 | Veeramma et al. ........... 257/329 |
| 8,716,067 | B2 | 5/2014 | Wisotzki et al. .............. 438/113 |
| 8,716,745 | B2 | 5/2014 | Veeramma .................... 257/109 |
| 9,590,033 | B1 | 3/2017 | Wisotzki et al. | |
| 2004/0169262 | A1 | 9/2004 | Oliver et al. | |
| 2009/0273913 | A1 | 11/2009 | Otremba | |
| 2015/0061090 | A1 | 3/2015 | Oyama | |
| 2016/0027866 | A1 | 1/2016 | Yoshikawa | |

FOREIGN PATENT DOCUMENTS

| | | |
|---|---|---|
| EP | 0364760 | 9/1988 |
| JP | H1093113 A | 4/1998 |
| JP | 2014011213 A | 1/2014 |

OTHER PUBLICATIONS

Data sheet for DWN 17-18 Diode Chip, IXYS Corporation Dec. 15, 2015 (2 pages).
Lutz et al., "Semiconductor Power Devices—Physics, Characteristics, Reliability," Springer-Verlag Berlin Heidelberg 2011, ISBN 978-3-642-11124-2, Library of Congress Control No. 2010934110, pp. 146-147 (5 pages).
Data Sheet entitled, "FRED, Rectifier Diode and Thyristor Chips in Planar Design," IXYS Corporation 2004 (5 pages).
European Search Report and Written Opinion for the European Patent Application No. 18191836, dated Jan. 22, 2019.

PACKAGED FAST INVERSE DIODE COMPONENT
FOR PFC APPLICATIONS

PACKAGED DEVICE IN A PFC BOOST CONVERTER

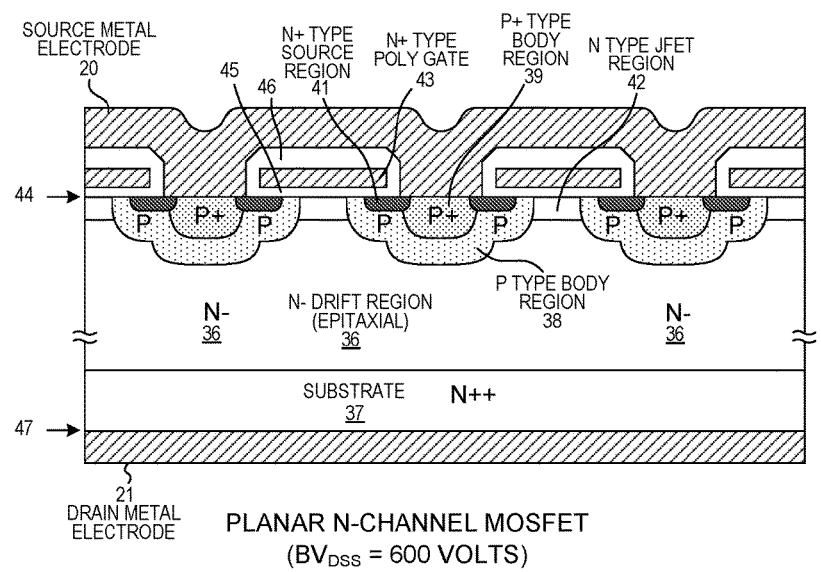

PLANAR N-CHANNEL MOSFET
($BV_{DSS}$ = 600 VOLTS)

FIG. 3

| REGION | CONCENTRATION OR DOSE | DOPANT OR MATERIAL | THICKNESS OR DEPTH |
|---|---|---|---|
| N++ TYPE SUBSTRATE | $2 \times 10^{19}$ atoms/cm³ | PHOSPHORUS | 94 microns thick |
| N- TYPE DRIFT REGION | $3 \times 10^{14}$ atoms/cm³ | PHOSPHORUS | 55 microns thick |
| P TYPE BODY REGION | $1 \times 10^{17}$ atoms/cm³ | BORON | 2.5 microns thick |
| P+ TYPE BODY CONTACT | $1 \times 10^{19}$ atoms/cm³ | BORON | 1.8 microns thick |
| N+ TYPE SOURCE REGION | $5 \times 10^{19}$ atoms/cm³ | PHOSPHORUS | 0.3 micron thick |
| N TYPE JFET REGION | $5 \times 10^{15}$ atoms/cm³ | PHOSPHORUS | 1.0 micron thick |
| N+ TYPE POLYSILICON GATE | $1 \times 10^{20}$ atoms/cm³ | PHOSPHORUS | 0.6 microns thick |
| SOURCE METAL ELECTRODE | | ALUMINUM | 4.0 microns thick |
| DRAIN METAL ELECTRODE | | Ti/Ni/Ag | 1.0 microns thick |
| GATE METAL ELECTRODE | | ALUMINUM | 4.0 microns thick |
| GATE OXIDE | | $SiO_2$ | 0.12 microns thick |
| OVER GATE OXIDE | | $SiO_2$ | 1.0 microns thick |

PLANAR N-CHANNEL MOSFET

FIG. 4

FAST RECOVERY INVERSE DIODE

TOP-DOWN VIEW OF THE SEMICONDUCTOR SURFACE

| REGION | CONCENTRATION OR DOSE | DOPANT OR MATERIAL | THICKNESS OR DEPTH |
|---|---|---|---|
| P- TYPE BOTTOMSIDE REGION | 4E16 atoms/cm$^3$ | BORON | 3 microns thick |
| N- TYPE DRIFT REGION | 2E14 atoms/cm$^3$ | PHOSPHORUS | 28 microns thick |
| N TYPE DEPLETION STOP REGION | 3E16 atoms/cm$^3$ | | 1.6 microns thick |
| P TYPE PERIPHERAL SIDEWALL REGION | 1E18 - 5E19 atoms/cm$^3$ | ALUMINUM | 33 microns deep 50 microns wide at top |
| P+ TYPE CHARGE CARRIER EXTRACTOR REGION | 5E19 atoms/cm$^3$ | BORON | 0.4 micron thick |
| P+ TYPE FLOATING FIELD RING | 5E19 atoms/cm$^3$ | BORON | 0.6 micron thick |
| N+ TYPE CATHODE CONTACT REGION | 5E19 atoms/cm$^3$ | PHOSPHORUS | 0.5 micron thick |
| METAL CATHODE ELECTRODE | | ALUMINUM | 4 microns thick |
| METAL ANODE ELECTRODE | | Ti-Ni-Ag | 1 micron thick |
| TOPSIDE PASSIVATION LAYER | | Si$_3$N$_4$ AND/OR POLYIMIDE | 0.6 microns thick |

FAST RECOVERY INVERSE DIODE
(REVERSE BREAKDOWN VOLTAGE RATING = 550 VOLTS)

FIG. 7

| | FAST RECOVERY DIODE |
|---|---|
| DEVICE SIZE (cm$^2$) | 0.05 cm$^2$ |
| FORWARD VOLTAGE DROP ($V_f$) | 1.109 volts |
| FORWARD CURRENT ($I_f$) | 10 amperes |
| REVERSE VOLTAGE ($V_r$) | 100 volts |
| TIME BETWEEN ZERO CROSSINGS ($T_{zz}$) | 58.4 nanoseconds |
| PEAK REVERSE RECOVERY CURENT ($I_{rr}$) | -3.90 amperes |
| REVERSE BRAKDOWN VOLTAGE ($V_{br}$) | 632.4 volts |
| MAX Di/dt OF $I_{rr}$ (A/us) | 100 amperes/microsec. |
| REVERSE LEAKAGE CURRENT ($I_{lk}$) @450V | 2.04 microamperes |

FAST RECOVERY INVERSE DIODE
(REVERSE BREAKDOWN VOLTAGE RATING = 550 VOLTS)

FIG. 8

(FORWARD BIAS - FORWARD CURRENT)

HOLES EXTRACTED THROUGH P+ TYPE CHARGE EXTRACTION REGION
CORRESPONDING ELECTRONS EXPELLED DUE TO CHARGE NEUTRALITY
(FORWARD BIAS - FORWARD CURRENT)

(SWITCH TO REVERSE BIAS - REVERSE RECOVERY CURRENT)

ELECTRONS PASS THROUGH N+ CONTACT REGION
(SWITCH TO REVERSE BIAS - REVERSE RECOVERY CURRENT)

PACKAGED FAST INVERSE DIODE COMPONENT FOR PFC APPLICATIONS

TECHNICAL FIELD

The described embodiments relate to inverse diode devices and to related methods.

BACKGROUND INFORMATION

Most all types of commercially-available power diodes that have high reverse breakdown voltage capabilities also have N-type bottomside cathodes. A rare exception is the so-called "inverse diode" or "reverse diode" that is commercially available from IXYS Corporation, 1590 Buckeye Drive, Milpitas, Calif. These unusual diodes have P type isolation structures involving a bottomside P type anode region as well as P type peripheral sidewall diffusion regions. These unusual diodes have a few superior characteristics as compared to other types of diodes. For example, they may have high reverse breakdown voltages while simultaneously exhibiting superior dynamic robustness. Ways of extending this inverse diode architecture into new areas of application are sought.

SUMMARY

A novel four-terminal packaged semiconductor device has a first package terminal T1, a second package terminal T2, a third package terminal T3, a fourth package terminal T4, and a package body. Within the package body is a die attach tab, an N-channel field effect transistor (NFET) die and a novel fast recovery inverse diode device die. The NFET die and the fast recovery inverse diode die are mounted to the die attach tab within the package body such that a bottomside drain electrode of the NFET die is electrically coupled via the die attach tab to a bottomside P type anode region of the inverse diode die. The NFET die, the fast recovery inverse diode die, and the die attach tab are typically overmolded with an amount of injection molded encapsulant. The first package terminal T1 is coupled to, or is a part of, the die attach tab. The second package terminal T2 is coupled to a topside gate electrode of the NFET die. The third package terminal T3 is coupled to a topside source electrode of the NFET die. The fourth package terminal T4 is coupled to a topside cathode electrode of the inverse diode die.

The fast recovery inverse diode die is an "inverse diode" in that its anode is on the bottomside of the die and is a P type region, and in that it has a P type isolation structure. The P type isolation structure isolates and separates a central active area of the die from the four die side edges and from the bottom semiconductor surface of the die. The fast recovery inverse diode die also has all of the following characteristics: 1) a low forward voltage drop ($V_f$) of less than 1.5 volts in a high current forward conduction condition of 10 amperes, 2) a peak reverse recovery current ($I_{rr}$) that is less than 5 amperes when the inverse diode die switches from the high current forward current condition to a −100 volt reverse voltage condition, 3) a reverse breakdown voltage ($V_{br}$) withstand capability of at least 550 volts, and 4) a reverse leakage current ($I_{lk}$) of less than 100 microamperes in a 450 volt static reverse blocking condition. The NFET die is a planar N-channel power MOSFET that has a breakdown voltage ($BV_{DSS}$) of at least 600 volts. The novel packaged semiconductor device is particularly advantageous and convenient when used in a 400 volt DC output voltage PFC (Power Factor Correction) boost converter circuit.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 3 is a cross-sectional side view diagram of the NFET die within the packaged semiconductor device of FIG. 1.

FIG. 4 is a table that sets forth concentrations, dopant types, constituent materials, thicknesses and depths for the various parts of the NFET die of FIG. 3.

FIG. 7 is a table that sets forth concentrations, dopant types, constituent materials, thicknesses and depths for the various parts of the inverse diode device die of FIG. 5.

FIG. 8 is a table that sets forth operational characteristics of the inverse diode device die of FIG. 5.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "top", "topside", "up", "upward", "down", "downward", "vertically", "laterally", "side", "under", "backside", "bottom" and "bottomside" are used herein to describe relative orientations between different parts of the structure being described, and it is to be understood that the overall structure being described can actually be oriented in any way in three-dimensional space. When processing is described in the description below as being performed on the bottom of the wafer, such as for example when dopants are said to diffuse upward, it is understood the wafer may actually be oriented upside down during these processing steps, and may be processed from the top in ordinary fashion. In the description below, P type silicon can be generally referred to simply as P type silicon or it can be more specifically referred to as P++ type silicon, P+ type silicon, P type silicon, or P− type silicon. The P++, P+, P and P− designators are intended to designate relative ranges of dopant concentrations in a rough general sense. There may, for example, be an overlap in the ranges of concentrations between silicon described as P+ type silicon and silicon described as P type silicon. The dopant concentration at the bottom of the P+ type silicon range may be lower than the dopant concentration at the top of the P type silicon range. The same manner of describing N type silicon (in terms of sometimes more specifically referring to N+ type silicon, N type silicon, or N− type silicon) is also employed in this patent document.

Figure 1:
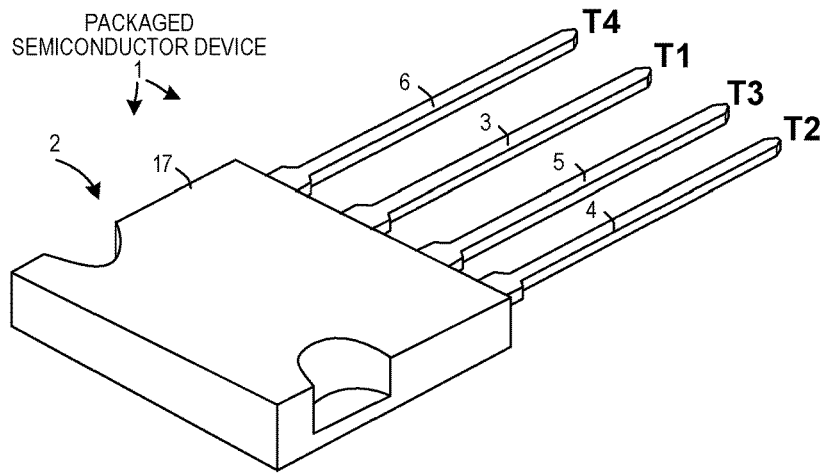
FIG. 1 is a perspective diagram of a packaged semiconductor device in accordance with one novel aspect.

FIG. 1 is a perspective diagram of a packaged semiconductor device 1 in accordance with one novel aspect. Packaged semiconductor device 1 includes a package body portion 2, a first package terminal T1 3, a second package terminal T2 4, a third package terminal T3 5, and a fourth package terminal T4 6. The body portion 2 includes a die attach tab 7, an N-channel field effect transistor (NFET) die 8, a fast recovery inverse diode die 9, bond wires 10-16, and an amount of injection-molded encapsulant 17. The amount of injection molded plastic encapsulant 17 overmolds and encapsulates the NFET die 8 and the fast recovery inverse diode die 9, the bond wires 10-16, and the die attach tab 7. In this example, the first package terminal T1 is actually an extension of die attach tab 7. The first package terminal T1 and the die attach tab 7 are parts of the same single piece of stamped copper sheet. The metal of these terminals is metal of a leadframe and the overmolding or injection-molding with encapsulant (for example, by injection-molded polymerizing resin) is as carried out in conventional semiconductor device injection molding packaging process.

Figure 2:
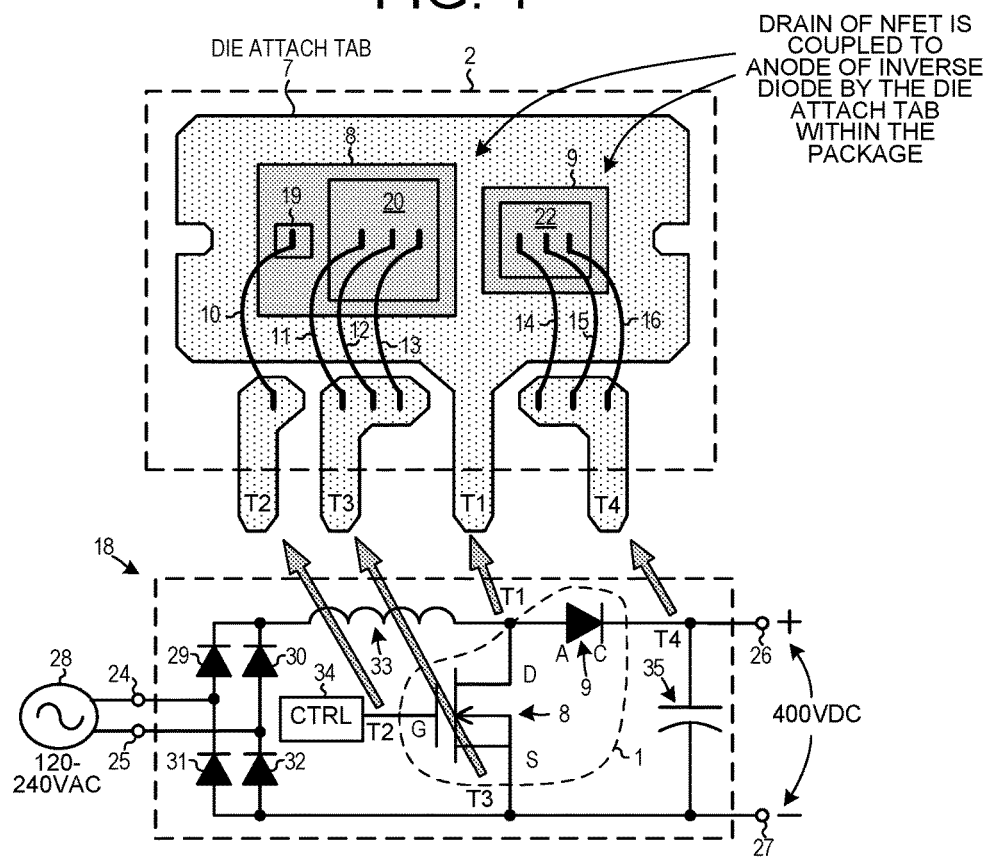
FIG. 2 is a diagram that illustrates the circuitry inside the packaged semiconductor device of FIG. 1 and also shows how the packaged semiconductor device of FIG. 1 is used in a PFC AC-to-DC boost converter circuit.

FIG. 2 is a diagram that illustrates the circuitry inside the packaged semiconductor device 1. FIG. 2 also shows how the packaged semiconductor device 1 is used in a 400 volt output voltage PFC AC-to-DC boost converter 18. The NFET die 8 has a topside gate electrode and bond pad 19, a topside source electrode and bond pad 20, and a bottomside drain electrode and bond pad 21. The fast recovery inverse diode die 9 has a topside cathode electrode and bond pad 22, and a bottomside anode electrode and bond pad 23. The topside gate electrode 19 of the NFET die 8 is coupled by bond wire 10 to package terminal T2. The topside source electrode 20 of the NFET die 8 is coupled by bond wires 11-13 to package terminal T3. The topside cathode electrode 22 of the inverse diode die 9 is coupled by bond wires 14-16 to fourth terminal T4. Importantly, the bottomside drain electrode 21 of NFET die 8 and the bottomside anode terminal 23 of the inverse diode die 9 are both mounted on the die attach tab 7 such that the die attach tab 7 electrically couples the bottomside drain electrode 21 of NFET die 8 to the bottomside anode terminal 23 of the inverse diode die 9. NFET die 8 and inverse diode die 9 may, for example, be soldered directly to the die attach tab 7.

The PFC AC-to-DC boost converter 18 of FIG. 2 has two input terminals 24 and 25 and two output terminals 26 and 27. Boost converter 18 receives a 240 volt AC RMS sinusoidal input supply voltage from AC power source 28 onto input terminals 24 and 25. The boost converter 18 outputs a 400 volt DC voltage onto the output terminals 26 and 27. Boost converter 18 includes a full bridge rectifier involving four diodes 29-32, an inductor 33, the packaged semiconductor device 1, a control circuit 34, and an output capacitor 35, all interconnected as illustrated in FIG. 2. The manufacture of the boost converter 18 is facilitated by the existence of the novel packaged semiconductor device 1.

NFET die 8 is an N-channel planar-type power field effect transistor that has a breakdown voltage ($BV_{DSS}$) of at least 600 volts. The inverse diode die 9 is a so-called "inverse diode" in that its anode is on the bottomside of the die and is a P type region, and in that it has a P type isolation structure. This P type isolation structure isolates and separates a central active area of the die from the four die side edges and from the bottom surface of the die. The inverse diode die 9 also has all of the following characteristics: 1) a low forward voltage drop ($V_f$) of less than 1.5 volts in a high current forward conduction condition of 10 amperes, 2) a peak reverse recovery current ($I_{rr}$) that is less than 5 amperes when the inverse diode die switches from the high current forward current condition to a −100 volt reverse voltage condition, 3) a reverse breakdown voltage ($V_{br}$) withstand capability of at least 550 volts, and 4) a reverse leakage current ($I_{lk}$) of less than 100 microamperes in a 450 volt static reverse blocking condition. In one example, the inverse diode die 9 achieves these performance characteristics without extra recombination centers having been introduced into the silicon material of the die such as by electron irradiation, or by the inclusion of heavy metal atoms, or by hydrogen or helium ion implantation, or by the inclusion of so-called "lifetime killers".

FIG. 3 is a cross-sectional side view diagram of the NFET die 8. An N− type drift region 36 is disposed on an N++ type silicon substrate layer and region 37. The P body of the device includes a P type body region portion 38 as well as a more heavily doped P+ type body region 39. Reference numeral 41 identifies the N+ type source region. Reference numeral 42 identifies an N type JFET region. Reference numeral 43 identifies an N+ type polysilicon gate. This gate is separated from the top semiconductor surface 44 by gate oxide 45. More oxide 46 is disposed over the gate. The bottomside drain electrode 21 is disposed on the bottom semiconductor surface 47. The topside source electrode 20 is disposed over the oxide 46. The topside gate metal electrode 19 is not present in the particular cross-section of the illustration, so it is not shown.

FIG. 4 is a table that sets forth concentrations, dopant types, constituent materials, thicknesses and depths for the various parts of the NFET die 9.

Figure 5:
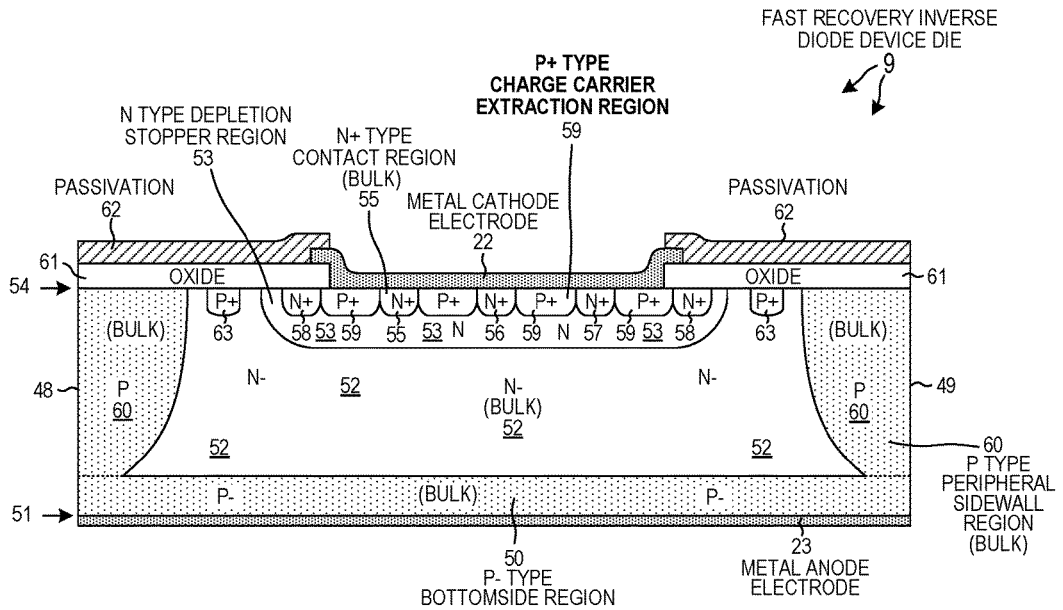
FIG. 5 is a cross-sectional side view diagram of the inverse diode die within the packaged semiconductor device of FIG. 1.

FIG. 5 is a cross-sectional side view diagram of the inverse diode die 9. The die 1 has a rectangular top surface, a rectangular bottom surface, and four peripheral side edges. Two of the side edges 48 and 49 are illustrated in the cross-sectional side view diagram of FIG. 5. More particularly, a bottomside P− type silicon region 50 extends upward from the planar bottom semiconductor surface 51 of the die and also extends laterally outwardly to all four peripheral side edges of the die. An N− type silicon region 52 is disposed on and over the bottomside P− type silicon region 50 as shown in FIG. 5. This N− type silicon region 52, which is also referred to as the N− drift region, is of the same bulk wafer material as is the bottomside P− type silicon region 50. The N− type silicon region 52 is the cathode of the inverse diode die because the principal PN junction of the diode is the junction between the top of the bottomside P− type silicon region 50 and the bottom of the N− type silicon region 52. An N type depletion stopper region 53 extends down from the top semiconductor surface 54 down into the N− type silicon region 52. N+ type contact regions extend down from the top semiconductor surface 54 down into the N type depletion stopper region 53 as illustrated. There are three N+ type contact regions 55-57 in the particular cross-section illustrated in FIG. 5. There is also a ring-shaped N+ type depletion stopper region 58. A novel P+ type charge carrier extraction region 59 extends down from the top semiconductor surface 54 down into the N type depletion stopper region 53 as illustrated.

Figure 6:
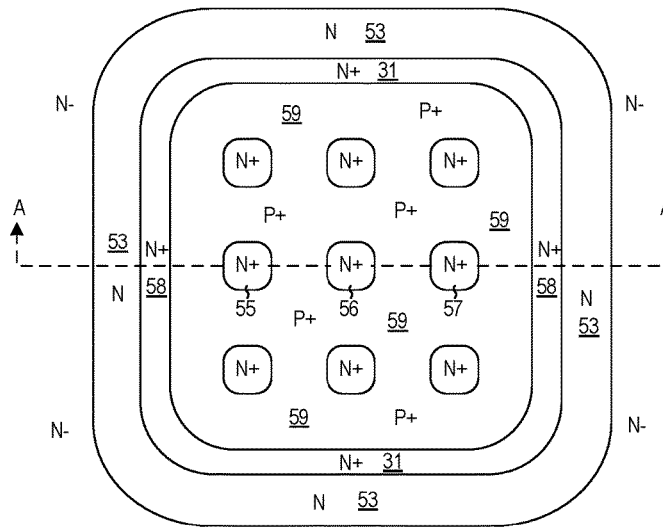
FIG. 6 is a top-down diagram of the P+ type charge carrier extraction region of the inverse diode device die of FIG. 5.

FIG. 6 is a top-down diagram of the P+ type charge carrier extraction region 59 and the N+ type contact regions 55-57, the ring-shaped N+ type depletion stopper region 58, and the N type depletion stopper region 53. The top-down diagram of FIG. 6 is a view taken looking down onto the top semiconductor surface of the die. The cross-sectional view of FIG. 5 is taken along the sectional line A-A' of FIG. 6. As can be seen from the top-down view of FIG. 6, the nine N+ type contact regions are disposed in a two-dimensional array of rows and columns. Each of the nine N+ type contact regions is laterally surrounded by P+ type silicon of the P+ type charge carrier extraction region 59. The ring-shaped N+ type depletion stopper region 58 extends around the outer periphery of the P+ type charge carrier extraction region 59. The depth of the nine N+ type contact regions, the depth of the ring-shaped N+ type depletion stopper region, and the depth of the P+ type charge carrier extraction region are similar. In this example these depths are in a range of about 0.4 microns to about 0.6 microns. The depth of the N type depletion stopper region 53 is about 1.6 microns, where this distance is measured from the top of the N− type region 52 to the bottom of the P+ type charge carrier extraction region 59. The N type depletion stopper region 53 is made adequately thicker than the P+ type charge carrier extraction region 59 so that under the desired maximum reverse blocking voltage of the device the principal depletion region (from the PN junction between regions 50 and 52) does not extend upward so far as to reach the depletion region at the PN junction between the bottom of the P+ type charge carrier extraction region 59 and N type silicon of the N type depletion stopper region 53. A P+ type floating field ring 63 extends down from the top semiconductor surface 54 down into the N− type silicon region 52 as illustrated. P+ type floating field ring 63 peripherally rings around the central active area of the die where the N type depletion stopper region 53 is located.

The die also has a P type silicon peripheral sidewall region 60 that extends laterally inwardly from the four peripheral side edges of the die such that it rings around the central N− type silicon region 52. The P type silicon peripheral sidewall region 60 extends down and joins the bottomside P− type silicon region 50 and also extends up to the top semiconductor surface 54. The combination of the P type peripheral region 60 and the bottomside P− type silicon region 50 form what is called the "P type isolation structure" (also sometimes called the "P type isolation region", or the "P type separation diffusion structure", or the "P type separation diffusion region"). P type silicon of this structure fully surrounds the N− type silicon region 52 both peripherally from the sides as well as underneath from the bottom. In one example, the P type separation diffusion structure is made by diffusing aluminum downward from the top semiconductor surface 54 so as to form region 60, and by ion implanting the bottom of the wafer with P type dopants and then activating the dopants by laser annealing to form the region 50.

For additional information on various suitable different P type separation diffusion structures and how to form them, see: 1) U.S. Pat. No. 7,442,630, entitled "Method For Fabricating Forward And Reverse Blocking Devices", filed Aug. 30, 2005, by Kelberlau et al.; 2) U.S. Pat. No. 5,698,454, entitled "Method Of Making A Reverse Blocking IGBT", filed Jul. 31, 1995, by N. Zommer; 3) J. Lutz et al., "Semiconductor Power Devices", pages 146-147, published by Springer, Berlin and Heidelberg (2011); 4) the data sheet entitled "Diode Chip", DWN 17-18, by IXYS Corporation of Milpitas, Calif. 95035, USA; 5) U.S. Pat. No. 9,590,033, entitled "Trench Separation Diffusion For High Voltage Device", filed Nov. 20, 2005, by Wisotzki et al.; 6) U.S. Pat. No. 4,351,677, entitled "Method of Manufacturing Semiconductor Device Having Aluminum Diffused Semiconductor Substrate", filed Jul. 10, 1980, by Mochizuki et al.; 7) U.S. Pat. No. 6,507,050, entitled Thyristors Having A Novel Arrangement of Concentric Perimeter Zones", filed Aug. 16, 2000, by Green; 8) U.S. Pat. No. 6,936,908, entitled "Forward and Reverse Blocking Devices", filed Mar. 13, 2002, by Kelberlau et al.; 9) U.S. Pat. No. 7,030,426, entitled "Power Semiconductor Component in the Planar Technique", filed Mar. 14, 2005, by Neidig; 10) U.S. Pat. No. 8,093,652, entitled "Breakdown Voltage For Power Devices", filed Aug. 27, 2003, by Veeramma et al.; 11) the 2004 description entitled "FRED, Rectifier Diode and Thyristor Chips in Planar Design", by IXYS Semiconductor GmbH, Edisonstrasse 15, D-68623, Lampertheim, Germany; 12) U.S. Pat. No. 8,716,067, entitled "Power Device Manufacture On The Recessed Side Of A Thinned Wafer", filed Feb. 20, 2012, by Wisotzki et al.; U.S. Pat. No. 8,716,745, entitled "Stable Diodes For Low And High Frequency Applications", filed May 11, 2006, by Veeramma. The entire subject matter of each of the following documents is incorporated herein by reference: 1) U.S. Pat. No. 7,442,630; 2) U.S. Pat. No. 5,698,454; 3) U.S. Pat. No. 9,590,033; 4) U.S. Pat. No. 4,351,677; 5) U.S. Pat. No. 6,507,050; 6) U.S. Pat. No. 6,936,908; 7) U.S. Pat. No. 7,030,426; 8) U.S. Pat. No. 8,093,652; 9) U.S. Pat. No. 8,716,067; 10) U.S. Pat. No. 8,716,745.

An oxide layer 61 is disposed directly on the top semiconductor surface 54 as shown. This oxide layer 61 laterally surrounds a cathode contact portion of the top semiconductor surface. The topside metal electrode 22 is disposed directly on the cathode contact portion of the top semiconductor surface 54 as illustrated. The topside metal electrode 22 is a cathode electrode or a cathode terminal of the inverse diode device. The bottomside metal electrode 23 is disposed directly on the bottom semiconductor surface 51 of the die. This bottomside metal electrode 23 extends all across the bottom semiconductor surface 51 from the die side edge 48 to the die side edge 49. Bottomside metal electrode 23 as well as the bottomside P− type region 50 are much wider than the topside metal electrode 22. Bottomside metal electrode 23 is the anode electrode or the anode terminal of the inverse diode device. A topside passivation layer 62 is disposed over the oxide layer 61 so that passivation overlaps and covers the peripheral edges of the topside metal electrode 22. All silicon regions between the bottom semiconductor surface 51 and the top semiconductor surface 54 are bulk silicon wafer material. There is no epitaxial silicon material.

FIG. 7 is a table that sets forth dopant concentrations, dopant types and dimensions of various parts of the inverse diode device die 9.

FIG. 8 is a table that sets forth operational characteristics of the inverse diode device die 9 of FIG. 5 that includes the novel P+ type charge carrier extraction region 59. The data in the table was obtained using the device simulator called Synopsys Sentaurus Workbench (SWB). The structure of the inverse diode of FIGS. 5-7 was first defined using the 2-D Sentaurus Structure Editor (SDE). The defined structure was then simulated using the device simulator (Sdevice) part of the workbench tool suite.

Figure 9:
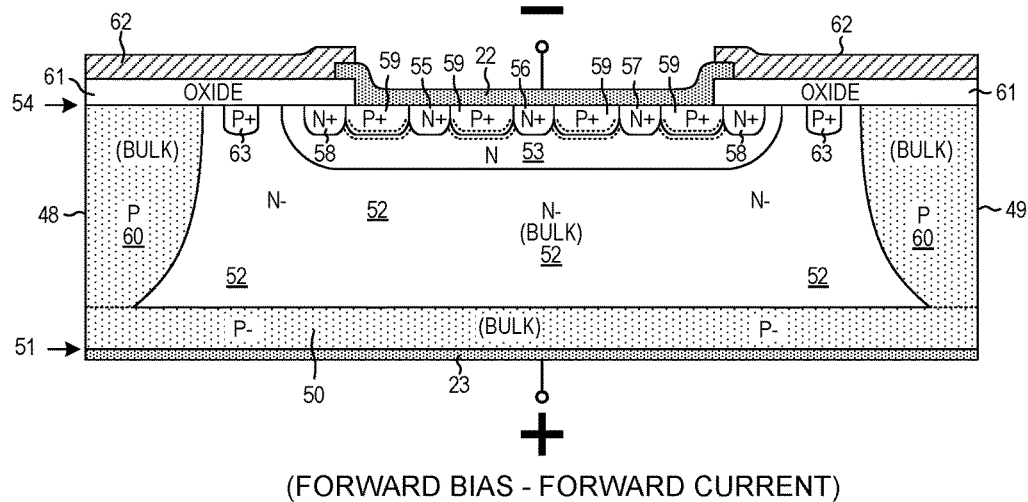
FIG. 9 is a cross-sectional side view diagram of the inverse diode device die of FIG. 5 in a forward conduction situation.
Figure 10:
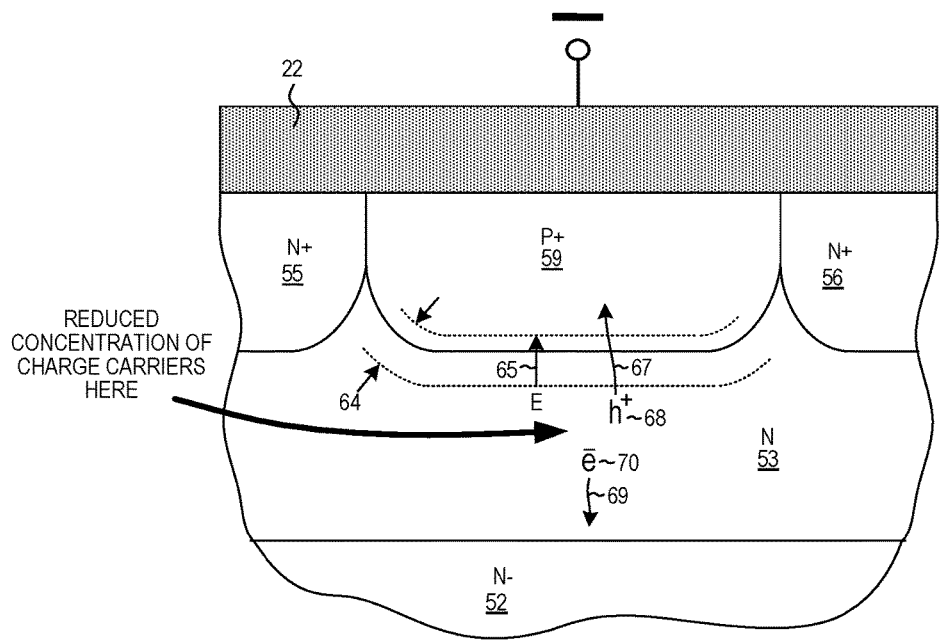
FIG. 10 shows a portion of FIG. 9 in an enlarged fashion.

FIG. 9 is a cross-sectional diagram that illustrates an operation of the inverse diode device die 9 in a forward bias situation. FIG. 10 shows a portion of the die of FIG. 9 in an enlarged fashion. In the forward bias condition, current flows from the anode electrode 23 on the bottom, up through the device, and out of the cathode electrode 22 on the top. During this time, there exists a high concentration of charge carriers in regions 52 and 53. This includes a high concentration of electrons and a high concentration of holes. When the voltage polarity across the diode is quickly reversed to a reverse blocking condition, the large number of electrons and holes in these regions 52 and 53 must somehow be eliminated before the diode can begin blocking current flow. Some of these charge carriers can be eliminated due to electrons and holes recombining, whereas others can be eliminated by the charge carriers flowing out of the diode die in the form of reverse recovery current $I_{rr}$. In order to reduce the peak magnitude of this reverse recovery current, the concentration of charge carriers in the regions 52 and 53 during forward bias conditions is reduced in the inverse diode device die 9. In the forward bias condition, a depletion region 64 exists at the boundary or boundaries between the P+ type charge carrier extraction region 59 and the N type depletion stopper region 53. This depletion region 64 is illustrated in FIG. 10. The depletion region 64 sets up an electric field 65 across the depletion region. The direction of this electric field 65 is indicated by the arrow 65. Holes that happen to be close to or at the boundary of the depletion region 64 are swept across the depletion region 64 in the direction of the arrow 65 due to this localized charge extracting electric field. Arrow 67 in FIG. 10 illustrates the path of one such representative hole 68. The extraction of holes is continuous as the diode operates in its forward conduction mode. The continuous extraction of holes by the localized charge extracting electric field 64 reduces the concentration of holes in the regions 52 and 53 of the diode device in the forward bias condition (as compared to the concentration of holes that otherwise would be present were the P+ type charge carrier extraction regions not present). In addition, corresponding electrons in the neighborhood of the extracted holes in the neighborhood tend to be expelled. Charge neutrality is maintained in region 53 and region 52, so electrons are expelled from the bottom of the device. Arrow 69 in FIG. 10 illustrates the path of one such representative electron 70. This flow of electrons is also continuous as the diode operates in its forward conduction mode. The flow of electrons reduces the concentration of electrons in the regions 53 and 52 of the device in the forward bias condition (as compared to the concentration of electrons that otherwise would be present were the P+ type charge carrier extraction regions not present). Due to the attendant reduction in the number of holes and electrons in the regions 53 and 52, there are fewer charge carriers to be removed from the diode when the diode is quickly switched from a forward conduction condition to a reverse voltage condition.

Figure 11:
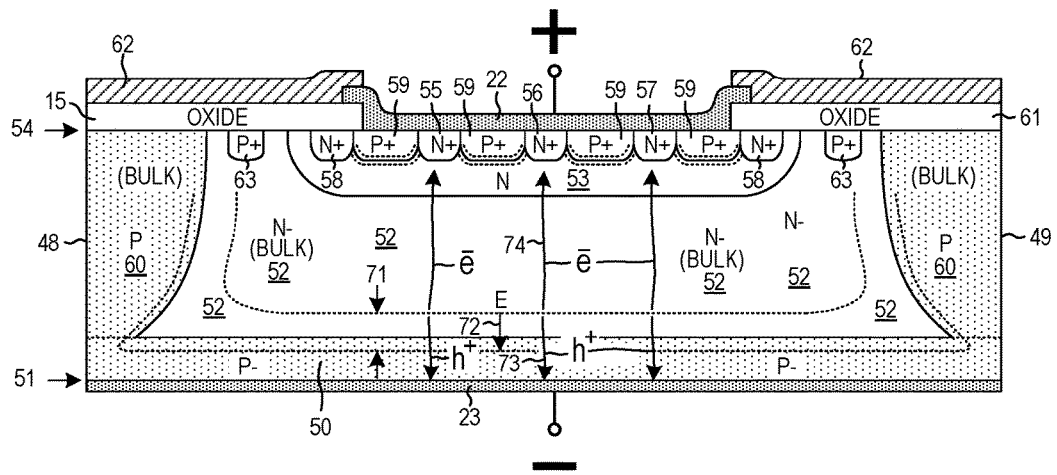
FIG. 11 is a cross-sectional side view diagram that illustrates an operation of the inverse diode device die of FIG. 5 when the voltage polarity across the diode device die is quickly switched from the forward conduction condition to a reverse blocking condition.
Figure 12:
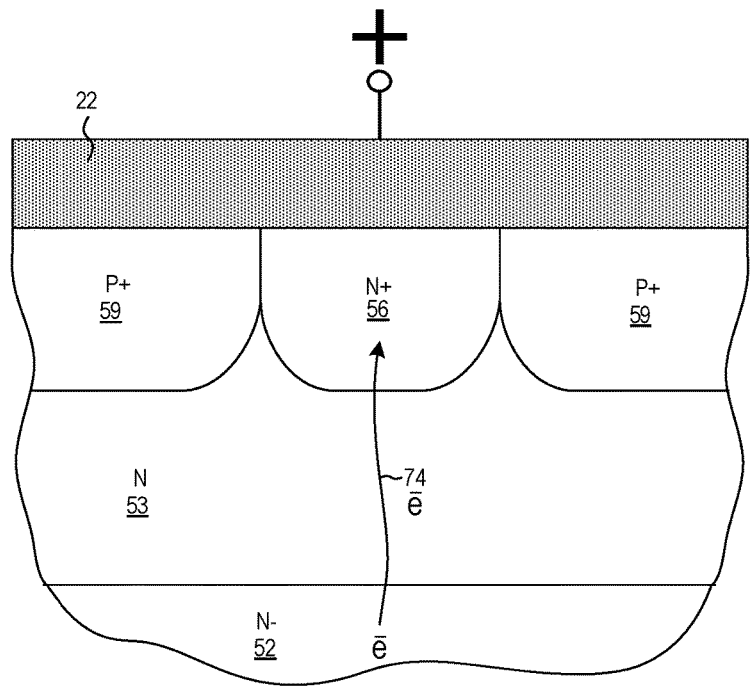
FIG. 12 shows a portion of the inverse diode device die of FIG. 11 in an enlarged fashion.

FIG. 11 is a cross-sectional diagram that illustrates an operation of the inverse diode device 9 when the diode device is switched from the forward bias condition to a reverse bias condition. FIG. 12 shows a portion of the inverse diode device die of FIG. 11 in an enlarged fashion. There is a depletion region 71 at the PN junction between the bottomside P– type silicon region 50 and the N– type silicon region 52. When the potential across the diode device is reversed, the depletion region 71 expands. It expands downward, but it expands far more upward due to the lower concentration in the N– silicon region. This depletion region 71 sets up an electric field 72. Holes from the expanding depletion region 71 move downward through the bottomside P– type silicon region 50 toward the anode electrode 23. Arrow 73 in FIG. 11 represents the path of one representative one of these holes. Electrons from the expanding depletion region 71 move upward through the N– type silicon region 52. Arrow 74 in FIG. 12 represents the path of one representative one of these electrons. FIG. 12 illustrates how these escaping electrons pass up through the N+ type contact regions on their way to the cathode electrode 22. Once charge carriers due to the expanding depletion region 71 have been removed from the diode device, and once excess charge carriers in regions 52 and 53 (that were present due to the high concentration of charge carriers in the forward bias condition) have been removed from the diode device, then the magnitude of the reverse recovery current $I_{rr}$ begins to decrease. The diode device then starts to operate in what is referred to here as its "static reverse blocking mode" of operation. The amount of reverse current flowing due to the reverse polarity across the diode device in a long term static condition, referred to as the reverse leakage current ($I_{lk}$), is small.

One conventional way to make a fast recovery diode is to reduce the lifetime of charge carriers present in the region of the diode where there are such charge carriers. This reduction in carrier lifetime can be accomplished by introducing so-called "recombination centers" into the silicon in the central drift region of the diode. These recombination centers are generally introduced by forming defects in the silicon through ion implantation, and/or by depositing ions or atoms into the silicon crystal lattice. Such recombination centers are generally beneficial during the short time of switching from the forward bias condition to the reverse bias condition because some electrons and holes present in the diode at that time can recombine. If these electrons and holes recombine, then they do not need to be removed from the diode in the form of reverse recovery current. Consequently, the recombination of electrons and holes due to the recombination centers serves to reduce the magnitude of the unwanted reverse recovery current. After this switching time has passed, however, and the diode begins operating in its static reverse blocking mode, these recombination centers and defects in the silicon lattice are undesirable and may cause the diode to leak. The reverse leakage current is therefore increased as compared to what the reverse leakage current would otherwise be were there to have not been added recombination centers and silicon defects. In the present inverse diode device die 9, however, the diode device uses the P+ type charge carrier extraction region 59 to reduce charge carrier concentrations. Accordingly, the silicon of the N– type silicon region 52 need not be implanted or damaged in order to create lifetime killer recombination centers. Advantageously, there are no specially added recombination centers or "lifetime killer" ions or charge carrier trapping atoms lodged in the silicon of N– type silicon region 52. The inverse diode die 9 therefore exhibits both good reverse recovery characteristics as well as a low reverse leakage current.

Figure 13:
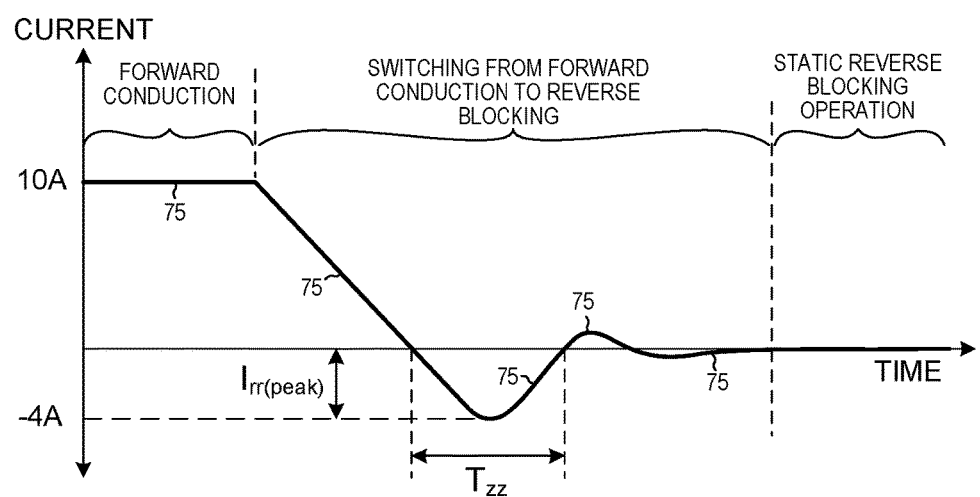
FIG. 13 is a waveform diagram that illustrates the time $T_{zz}$.

FIG. 13 is a waveform that illustrates a diode current waveform 75 during a switching episode of the inverse diode device die 9. Initially, a forward current of 10 amperes is conducted through the diode device die. During this forward conduction time, there is a forward voltage drop ($V_f$) across the diode. The voltage polarity across the diode device die is then quickly switched so that diode device die 9 blocks current flow. The time $T_{zz}$ is defined here as the time from when the reverse recovery current $I_{rr}$ through the diode (when transitioning from a forward conduction condition to a reverse blocking condition) first drops to a negative current until it again rises and reaches zero current. The peak of the reverse recovery current ($I_{rr(PEAK)}$) occurs between these two zero crossing times. As illustrated in FIG. 13, the time $T_{zz}$ is the time interval between zero crossings of the reverse current during this reverse commutation episode.

There is no epitaxial silicon in the inverse diode device die 9. Long term dynamic ruggedness of the device may be improved due to the absence of any epitaxial silicon to oxide/passivation interface in the edge termination region of the device. To make this structure, topside processing is performed on an N− type wafer. After the topside passivation step, the wafer is thinned by backside grinding. P type dopants are implanted into the bottom thinned side of the wafer, and the P type dopants are activated by laser annealing. After bottomside metallization, the wafer is diced. Accordingly, there is no epitaxial silicon in the device. In another example, the inverse diode device die does have epitaxial silicon. The starting material is a P type wafer. N− type epitaxial silicon is grown on the wafer. After topside processing and topside passivation, the wafer is thinned by backside grinding. After bottomside metallization, the wafer is diced. The inverse diode device die 9 of the packaged semiconductor device 1 of FIG. 1 can be of either construction as long as it includes the novel P+ type charge carrier extraction region 59.

By use of wafer thinning, the thickness of the N− type region 52 of the resulting inverse diode device die 9 of FIG. 5 is reduced down to 28 microns, where this distance is measured from the top of the bottomside P− type region 50 to the bottom of the N type depletion stop region 53. The thickness of the N type depletion stop region 53 is 1.6 microns, where this distance is measured from the top of the N− type region 52 to the bottom of the P+ type charge carrier extraction region 59. The thickness of the P+ type charge carrier extraction region 59 is 0.4 microns, where this distance is measured from the top of the N type depletion stop region 53 to the top semiconductor surface 54. In a case in which the bottomside P− type region 50 is 3 microns thick, the overall thickness of the thinned wafer is 33 microns where this distance is measured from the bottom semiconductor surface 51 to the top semiconductor surface 54. For the Power Factor Correction (PFC) boost converter application of FIG. 2, only moderate reverse breakdown voltage withstand capability is required. The thinner N− type region of the inverse diode device die (between the bottom of region 53 and the top of region 50) allows the diode device die 9 to have both a low forward voltage $V_f$ drop (during forward conduction, at high current levels) as well as a small peak reverse recovery current $I_{rr}$. In the case of the PFC boost converter application of FIG. 2, the diode die 9 must withstand a reverse voltage of about 400 volts. The voltage rating of the device is 70 percent of its actual breakdown voltage, so a properly rate diode device die would have to have a breakdown voltage of about 550 volts. But in addition, another ten percent margin is required for manufacturability. Accordingly, the inverse diode device die 9 in the circuit of FIG. 2 is made to have a reverse breakdown rating of about 550 volts, and a target reverse breakdown voltage of 600 volts. For such a reverse diode device die, the wafer during diode manufacture is adequately thinned from its backside such that the resulting thickness of the N− type region 52 is about 28 microns. In this way, the advantages of the novel P+ type charge carrier extraction region 53 is applied to the PFC boost converter application of FIG. 2. In a high temperature situation of the PFC boost converter application, reverse leakage current through the inverse diode die 9 increases. The novel inverse diode device die 9 nonetheless still has a desirably low reverse leakage current while at the same time maintaining its "fast" nature (low $I_{rr(PEAK)}$) for the switching condition to which the diode die is subjected.

For additional information and details on how the fast recovery inverse diode die 9 might be made, see: U.S. patent application Ser. No. 15/693,392, entitled "Charge Carrier Extraction Inverse Diode", filed on Aug. 31, 2017, by Kyoung Wook Seok (the entire subject matter of which incorporated by reference herein).

Although certain specific embodiments are described above for instructional purposes, the teachings of this patent document have general applicability and are not limited to the specific embodiments described above. Although an example is set forth above in which the NFET die and the inverse diode die are mounted to a die attach tab, the NFET die and the inverse diode die can be mounted to another type of substrate. In the case of the substrate being a die attach tab, the first package terminal can be an extension of the die attach tab. The die attach tab and the first package terminal can be parts of the same piece of stamped metal, such as a part of a metal leadframe. In another example, the substrate is a separate structure and the first package terminal is electrically coupled to the separate structure (for example, by a bond wire). The first package terminal can also be bonded to the separate structure. The package body may involve injection molded plastic as described above, but it may also involve another type of encapsulating structure and material. In some examples, a part or a surface of the substrate is not covered by encapsulant so that this part or surface can better dissipate heat. Even though the substrate is not entirely encased by encapsulant, the encapsulant nevertheless encapsulates the NFET and the inverse diode on the substrate. Accordingly, various modifications, adaptations, and combinations of various features of the described embodiments can be practiced without departing from the scope of the invention as set forth in the claims.

What is claimed is:

1. A packaged semiconductor device comprising:
a first package terminal;
a die attach tab, wherein the die attach tab is coupled to the first package terminal;
an N-channel field effect transistor (NFET) die, wherein the NFET die has a topside gate electrode, a topside source electrode, and a bottomside drain electrode, wherein the bottomside drain electrode is mounted to the die attach tab;
an inverse diode die, wherein the inverse diode die comprises:
a bottomside P type silicon region that extends upward from a bottom semiconductor surface of the inverse diode die that also extends laterally outwardly to peripheral side edges of the inverse diode die;
an N− type silicon region disposed over the bottomside P type silicon region;
an N type depletion stopper region that extends downward from the top semiconductor surface and into the N− type silicon region;
a P+ type charge carrier extraction region that extends downward from the top semiconductor surface and into the N type depletion stopper region;

an N+ type contact region that extends downward from the top semiconductor surface and into the N type depletion stopper region;

a P type silicon peripheral sidewall region that extends downward from the top semiconductor surface into the N− type silicon region, wherein the P type silicon peripheral sidewall region joins the bottomside P type silicon region thereby forming a P type isolation structure, wherein the P type silicon peripheral sidewall region also laterally rings the N− type silicon region and separates the N type silicon region from the peripheral side edges of the inverse diode die;

a topside cathode electrode disposed on the N+ type contact region and on the P+ type charge carrier extraction region; and a bottomside anode electrode disposed on the bottom semiconductor surface of the inverse diode die, wherein the bottomside anode electrode is mounted to the die attach tab;

a second package terminal that is coupled to the topside gate electrode of the NFET die;

a third package terminal that is coupled to the topside source electrode of the NFET die;

a fourth package terminal that is coupled to the topside cathode electrode of the inverse diode die; and an amount of encapsulant that encapsulates the NFET die and the inverse diode die on the die attach tab portion of the first package terminal and die attach tab.

2. The packaged semiconductor device of claim 1, wherein the inverse diode die has a reverse leakage current ($I_{lk}$) of less than 100 microamperes in a 450 volt static reverse blocking condition.

3. The packaged semiconductor device of claim 1, wherein the first package terminal is an extension of the die attach tab, wherein the first package terminal and the die attach tab are two parts of a single piece of stamped metal.

4. The packaged semiconductor device of claim 1, wherein the first package terminal is bonded to the die attach tab.

5. The packaged semiconductor device of claim 1, wherein the first package terminal is coupled to the die attach tab via a bond wire.

6. The packaged semiconductor device of claim 1, wherein the packaged semiconductor device has four and no more than four package terminals.

7. The packaged semiconductor device of claim 1, wherein the inverse diode die has all of the following:
1) a low forward voltage drop ($V_f$) of less than 1.5 volts in a high current forward conduction condition of 10 amperes,
2) a peak reverse recovery current ($I_{rr}$) that is less than 5 amperes when the inverse diode die switches from the high current forward current condition to a 100 volt reverse voltage condition, 3) a reverse breakdown voltage ($V_{br}$) withstand capability of at least 550 volts, and
4) a reverse leakage current ($I_{lk}$) of less than 100 microamperes in a 450 volt static reverse blocking condition.

8. The packaged semiconductor device of claim 1, wherein the NFET die has a breakdown voltage ($BV_{DSS}$) of at least 550 volts.

9. A packaged semiconductor device comprising:
a first package terminal;
a die attach tab, wherein the die attach tab is coupled to the first package terminal;
an N-channel field effect transistor (NFET) die, wherein the NFET die has a topside gate electrode, a topside source electrode, and a bottomside drain electrode, wherein the bottomside drain electrode is mounted to the die attach tab;
an inverse diode die, wherein the inverse diode die has a topside cathode electrode, a bottomside P type silicon region and a bottomside anode electrode, wherein the bottomside anode electrode is mounted to the die attach tab, wherein the die attach tab electrically couples the bottomside drain electrode of the NFET to the bottomside anode electrode of the inverse diode die;
a second package terminal that is coupled to the topside gate electrode of the NFET die;
a third package terminal that is coupled to the topside source electrode of the NFET die;
a fourth package terminal that is coupled to the topside cathode electrode of the inverse diode die; and
an amount of encapsulant that encapsulates the NFET die and the inverse diode die on the die attach tab portion of the first package terminal and die attach tab.

10. The packaged semiconductor device of claim 9, wherein the first package terminal is an extension of the die attach tab, wherein the first package terminal and the die attach tab are two parts of a single piece of stamped metal.

11. The packaged semiconductor device of claim 9, wherein the first package terminal is bonded to the die attach tab.

12. The packaged semiconductor device of claim 9, wherein the first package terminal is coupled to the die attach tab via a bond wire.

13. The packaged semiconductor device of claim 9, wherein the inverse diode die has a top semiconductor surface, the inverse diode die further comprising:
an N type depletion stopper region that extends downward from the top semiconductor surface and into an N− type silicon region;
a P+ type charge carrier extraction region that extends downward from the top semiconductor surface and into the N type depletion stopper region; and
an N+ type contact region that extends downward from the top semiconductor surface and into the N type depletion stopper region, wherein the topside cathode electrode is coupled to both the P+ type charge carrier extraction region and the N+ type contact region.

14. The packaged semiconductor device of claim 9, wherein the inverse diode die has a reverse leakage current ($I_{lk}$) of less than 100 microamperes in a 450 volt static reverse blocking condition.

15. The packaged semiconductor device of claim 9, wherein the inverse diode die has all of the following:
1) a low forward voltage drop ($V_f$) of less than 1.5 volts in a high current forward conduction condition of 10 amperes,
2) a peak reverse recovery current ($I_{rr}$) that is less than 5 amperes when the inverse diode die switches from the high current forward current condition to a 100 volt reverse voltage condition,
3) a reverse breakdown voltage ($V_{br}$) withstand capability of at least 550 volts, and
4) a reverse leakage current (Ilk) of less than 100 microamperes in a 450 volt static reverse blocking condition.

16. The packaged semiconductor device of claim 9, wherein the packaged semiconductor device has four and no more than four package terminals.

17. A packaged semiconductor device comprising:
a first package terminal;

a substrate having a conductive surface, wherein the conductive surface is coupled to the first package terminal;

an N-channel field effect transistor (NFET) die, wherein the NFET die has a topside gate electrode, a topside source electrode, and a bottomside drain electrode, wherein the bottomside drain electrode is mounted to the substrate;

means for conducting a current in a forward voltage condition and for blocking current flow in a reverse voltage condition, wherein the means has a topside metal electrode and a bottomside metal electrode, wherein the bottomside metal electrode is mounted to the substrate, wherein the means is for:
1) conducting a forward current with a forward voltage drop of less than 1.5 volts in a 10 ampere forward conduction condition,
2) switching from the forward conduction condition to a 100 volt reverse voltage condition without conducting a reverse recovery current of more than 5 amperes,
3) withstanding a reverse voltage of at least 550 volts without suffering reverse breakdown, and
4) withstanding a 450 volt static reverse blocking condition without conducting a reverse leakage current of more than 100 microamperes;

a second package terminal that is coupled to the topside gate electrode of the NFET die;

a third package terminal that is coupled to the topside source electrode of the NFET die;

a fourth package terminal that is coupled to the topside metal electrode of the means; and an amount of encapsulant that encapsulates the NFET die and the means on the substrate.

18. The packaged semiconductor device of claim 17, wherein the first package terminal is an extension of the substrate, wherein the first package terminal and the substrate are two parts of a single piece of stamped metal.

19. The packaged semiconductor device of claim 17, wherein the first package terminal is bonded to the substrate.

20. The packaged semiconductor device of claim 17, wherein the first package terminal is coupled to the substrate via a bond wire.

\* \* \* \* \*

UNITED STATES PATENT AND TRADEMARK OFFICE
CERTIFICATE OF CORRECTION

PATENT NO.        : 10,319,669 B2
APPLICATION NO.   : 15/693416
DATED             : June 11, 2019
INVENTOR(S)       : Kyoung Wook Seok It is certified that error appears in the above-identified patent and that said Letters Patent is hereby corrected as shown below:

On the Title Page

At (71) Applicant: please correct to read --LITTELFUSE, INC.--
At (73) Assignee: please correct to read --LITTELFUSE, INC.--

Signed and Sealed this
Eleventh Day of February, 2020

Andrei Iancu
*Director of the United States Patent and Trademark Office*